(12) United States Patent
Huang et al.

(10) Patent No.: US 7,125,738 B2
(45) Date of Patent: Oct. 24, 2006

(54) METHOD OF FABRICATING A PHOTOSENSITIVE STRUCTURE

(75) Inventors: Ming-Jeng Huang, Taichung (TW); Chen-Chiu Hsue, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/963,659

(22) Filed: Oct. 14, 2004

(65) Prior Publication Data

US 2006/0084194 A1   Apr. 20, 2006

(51) Int. Cl.
*H01L 21/00*   (2006.01)

(52) U.S. Cl. .......................... 438/48; 438/75; 438/70; 438/60; 438/E31.075

(58) Field of Classification Search ..................... None
See application file for complete search history.

(56) References Cited

U.S. PATENT DOCUMENTS 5,239,412 A * 8/1993 Naka et al. ................. 359/619
5,479,049 A * 12/1995 Aoki et al. .................. 257/642

* cited by examiner

*Primary Examiner*—Dung A. Le
(74) *Attorney, Agent, or Firm*—Birch, Stewart, Kolasch & Birch, LLP.

(57) ABSTRACT

A method of fabrication of a photosensitive device is disclosed. A substrate with at least an insulator layer formed thereon is provided. The insulator layer comprises a plurality of photoreceiving regions, and a plurality of conductive patterns are formed thereon without covering the photoreceiving regions. A dielectric layer is formed on the insulator and the conductive patterns, and polished by CMP thereof. The dielectric layer comprises a first dielectric layer formed by PECVD and a second dielectric layer formed by HDPCVD.

6 Claims, 3 Drawing Sheets

METHOD OF FABRICATING A PHOTOSENSITIVE STRUCTURE

BACKGROUND OF THE INVENTION

1. Field of the Invention

The present invention relates to a semiconductor device fabrication, and more particularly to a method for forming a photosensitive device with color filter.

2. Description of the Related Art

FIG. 1 are schematic representations of structures in the final stages of formation of a photosensitive device using conventional technology. Referring to FIG. 1A, a planarized inter-metal dielectric layer 100 with a photoreceiving region 130 therein is formed on a substrate (not shown). A metal layer 114 is deposited and defined to expose the photoreceiving region 130 on the inter-metal dielectric layer 100, and a protective layer 150 is formed thereon.

Referring to FIG. 1B, a thick planar film 152, for example spin-on glass, is coated on a protective layer 150 for planarization. The planar film 152 and protective layer 150 are transparent for enhancing light sensitivity of the photosensitive device. A color filter process, comprising coating R, G, and B filters, development, etching and top coating, is then performed to form color filter 112. Next, another protective layer 120 is coated thereon to cover the color filter 112 and planar film 152.

The coated planar film 152 described cannot effectively fill in some concave areas of the photosensitive device to produce a flat surface over the entire wafer surface. Additionally, the planar film 152 must achieve a thick thickness, about 2 μm, to produce a flat surface. Shrinkage, however, may be generated, affecting flatness of the surface of the planar layer 152. The uneven layer 152 under the color filter 112 may diminish color performance of the device. Due to the unevenly coated dielectric layer 152, a yellow strip may occur in the step height regions, for example the regions near the bonding pads or the scribe lines.

SUMMARY OF THE INVENTION

Embodiments of the invention achieve technical advantages by providing a chemical mechanical polishing (CMP) process in the fabrication of a photosensitive device.

In accordance with an embodiment of the invention, a method for fabricating a photosensitive device comprises the following steps. A substrate with at least an insulator layer formed thereon is provided. The insulator layer comprises a plurality of photoreceiving regions, and a plurality of conductive patterns are formed thereon without covering the photoreceiving regions. A dielectric layer is formed on the insulator and the conductive patterns, and polished by CMP thereof.

In accordance with an embodiment of the invention, a photosensitive device comprises the following elements, at least an insulator layer comprising a plurality of photoreceiving regions is disposed on a substrate, a plurality of conductive patterns are disposed on the insulator layer without covering the photoreceiving regions, a dielectric layer with a flat surface is disposed on the conductive patterns and the insulator layer, wherein the dielectric layer has a thickness of 2000 Å~4000 Å on the conductive patterns.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

Figure 1A:
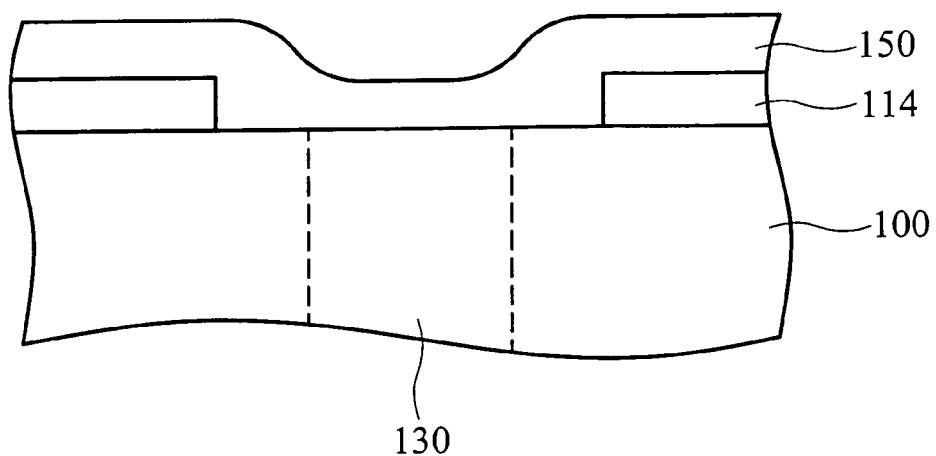
FIGS. 1A to 1B are schematic representations of structures in the final stages during the formation of the photosensitive device using conventional technology.
Figure 1B:
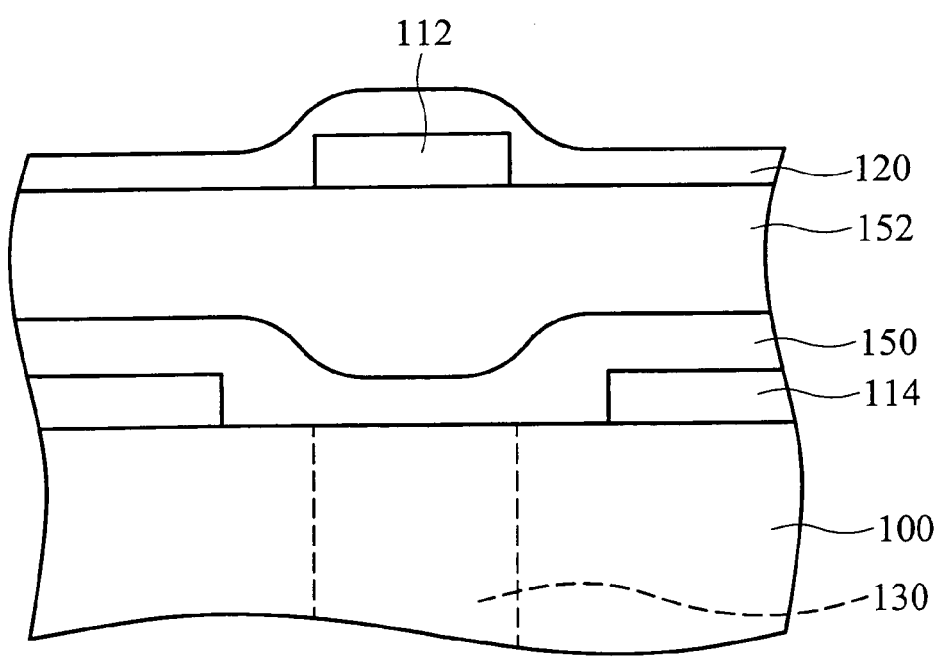
Figure 2A:
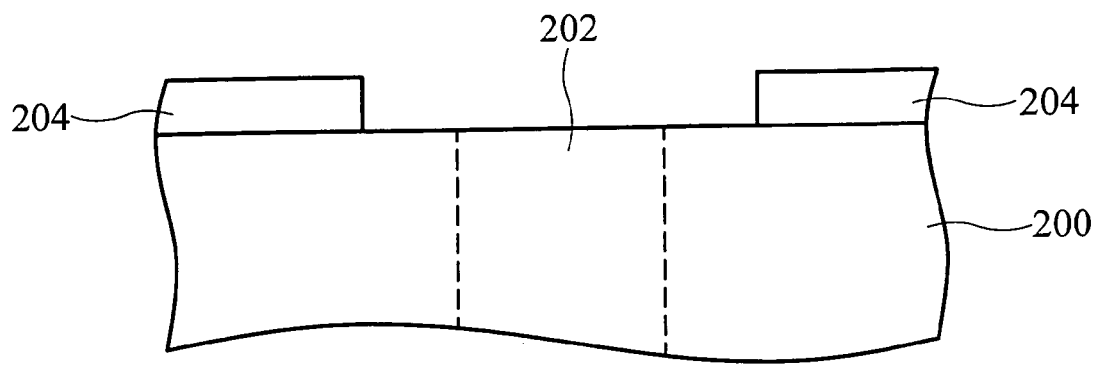
FIGS. 2A to 2D illustrate the fabrication method of a photosensitive device of an embodiment of the invention.

FIGS. 2A to 2D illustrate the fabrication method of a photosensitive device of an embodiment of the invention. Referring to FIG. 2A, a substrate, useful in forming a layered semiconductor device, is shown wherein an insulator layer 200 thereof comprises a photoreceiving region 202. This insulator layer 200 is the final inter-metal dielectric layer formed in photosensitive device. The photoreceiving region 202 is a light-receiving region and will have a converter (not shown in the figures) to transfer light into current. Hence, the material of this insulator layer 200 is transparent and can be made from any typical and well-known dielectric material used in sensor device, but is preferably silicon oxide.

A conductive layer (not shown) is deposited on the partially fabricated device. The material of this layer can be A1 and formed using any known technique such as reactive sputtering process (with or without collimation) wherein sputtering is carried out in an Ar+N2 atmosphere using an A1 target. The thickness of this conductive layer can be in the range of about 8000 Å to about 10000 Å. The conductive layer is patterned to expose the described photoreceiving region 202. The patterned conductive layer refers to conductive patterns 204 described later in this specification. The conductive patterns 204 can comprise conductive lines in cell regions, bonding pads or test pads with large step height in the periphery regions or scribe lines.

Figure 2B:
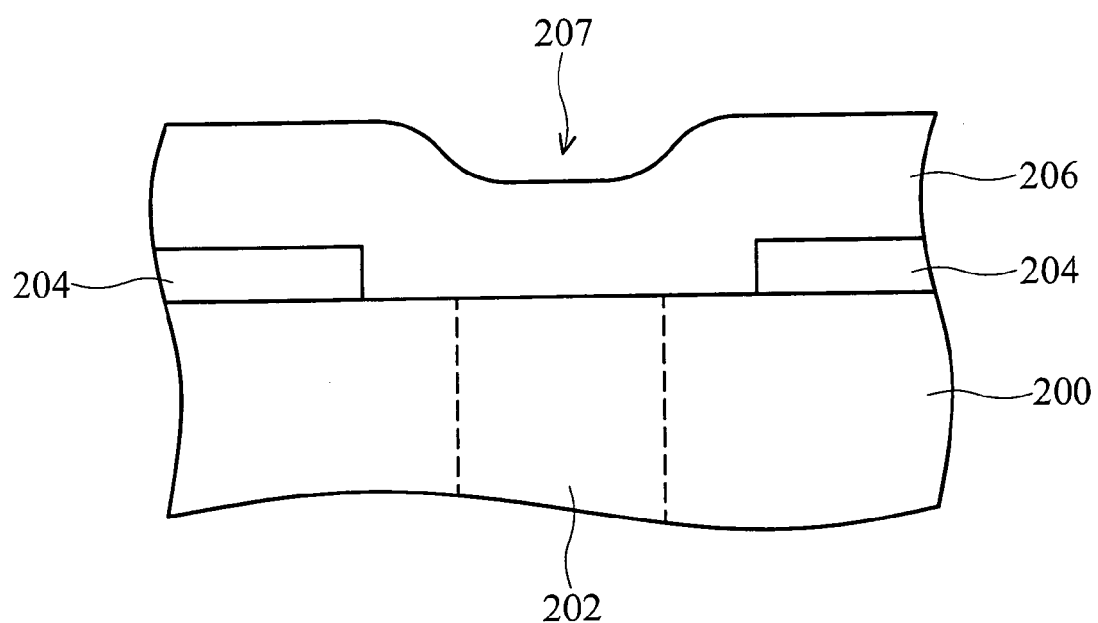

Referring to FIG. 2B, a dielectric layer 206 is formed on the insulator layer 200 and the conductive patterns 204. In this embodiment, the dielectric layer 206 is formed of transparent materials, for example silicon oxide or silicon oxynitride, thus the device is photosensitive. The dielectric layer 206 can be deposited by any deposition method, such as chemical vapor deposition (CVD), plasma enhanced chemical vapor deposition (PECVD), or high density plasma enhanced chemical vapor deposition (HDP). Preferably, the dielectric layer 206 comprises a first dielectric layer deposited by HDP to 1000 Å~2000 Å and a second dielectric layer deposited by PECVD to 7000 Å~10000 Å, thus increasing the gap filling. The thickness of the deposited dielectric layer 206 depends on the step height of the underlying conductive patterns 204, in which a gap between two conductive patterns 204 must be filled. The dielectric layer 206 formed of silicon oxide can further comprise a silicon nitride layer deposited thereon to protect the underlying photosensitive device.

Figure 2C:
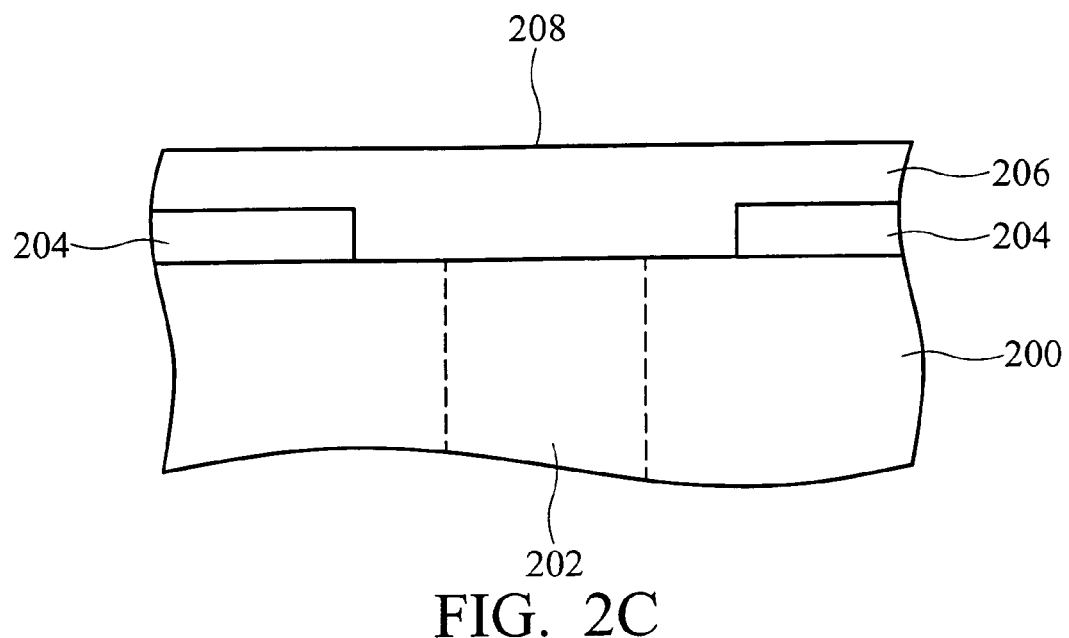

Referring to FIG. 2C, the dielectric layer 206 is polished to have a uniformly flat surface 208 over the entire wafer surface. In a preferred embodiment, the dielectric layer 206 is polished by chemical mechanical polishing (CMP). Dielectric layer 206, formed of silicon oxide, can be polished using fumed silica as slurry. In addition, the dielectric layer 206 comprising a silicon nitride layer thereon, colloidal silica can be used as slurry during polishing. The polished dielectric layer 206 preferably has a flat surface higher than the conductive pattern in a range between 2000 Å to 4000 Å.

Figure 2D:
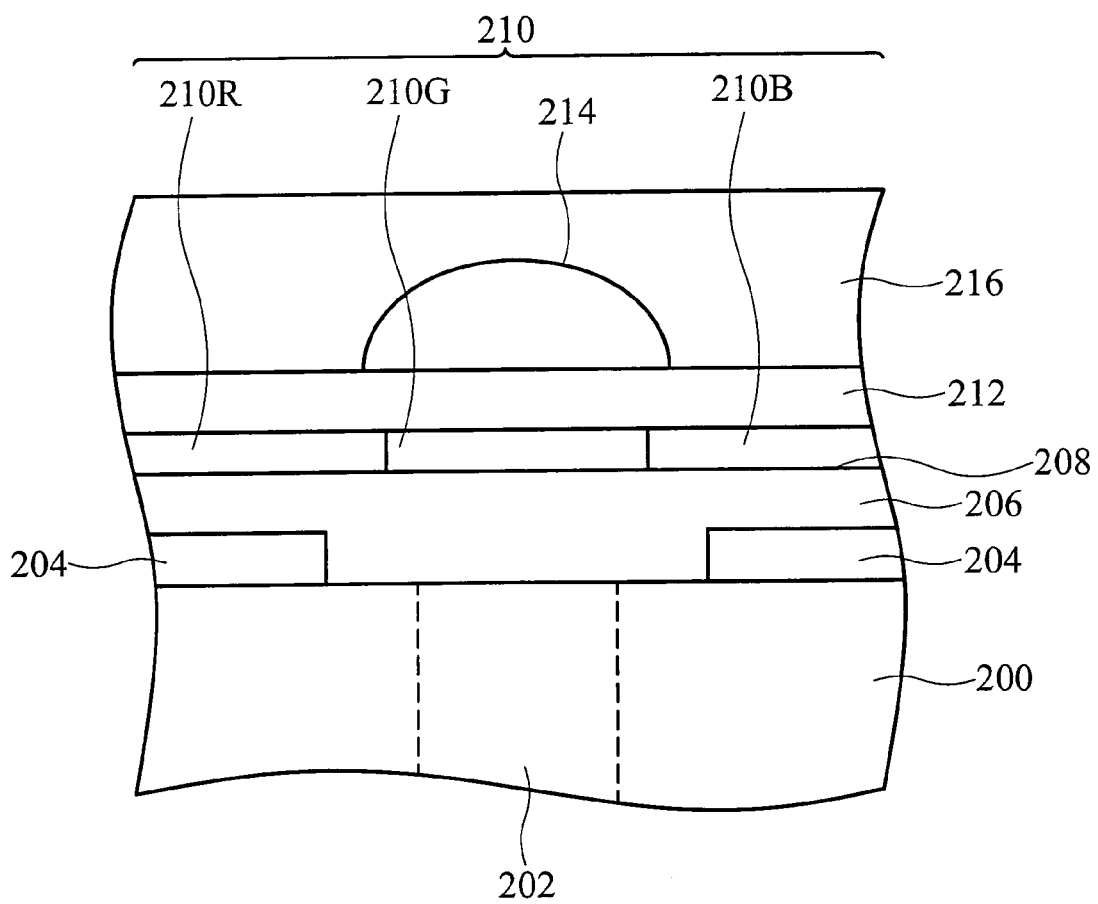

Referring to FIG. 2D, a color filter process is performed using photo resist to form R, G and B color filter layers (210R, 210G and 210B) respectively, and a upper planar layer 212 is coated thereon. A micro lens 214 is formed on the upper planar layer 212 by coating and defining an organic thin film, and a protective layer 216 is formed thereon.

FIG. 2D illustrates a photosensitive device of the embodiment. As shown in FIG. 2D, an insulator layer 200 comprising a plurality of photoreceiving regions 202 is formed on a substrate (not shown). A plurality of conductive patterns 204 is disposed on the insulator layer 200 without covering the photoreceiving regions 202. A dielectric layer 206 with a flat surface is disposed on the insulator layer 200 and the conductive patterns 204, and surface of the dielectric layer 206 is higher than the conductive patterns 204 in the range between 2000 Å to 4000 Å. The dielectric layer 206 is formed of transparent materials, such as silicon oxide or silicon oxynitride, thus the device is photosensitive. A color filter layer 210, an upper dielectric layer 212, a micro lens 214, and a protective layer 216 are disposed on the dielectric layer 206 in order.

Consequently, the dielectric layer 206 planarized by CMP is flatter than the planar layer formed by a conventional coating method. Specifically, due to the flat dielectric layer 206 achieved by CMP, yellow strips occurring in the conventional technology are ameliorated. Further, since the dielectric layer is planarized by CMP instead of coating a very thick film, better sensitivity and transmittance of photosensitive devices can be achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of thee appended claims should be accorded the broadest interpretation so as to encompass all such modifications and similar arrangements.

What is claimed is:

1. A method for fabricating a photosensitive device, comprising the steps of:

providing a substrate with at least an insulator layer formed thereon, wherein the insulator layer comprises a plurality of photoreceiving regions therein, a plurality of conductive patterns are formed on the insulator layer without covering the photoreceiving regions;

forming a dielectric layer on the insulator and the conductive patterns; and polishing the dielectric layer, wherein the dielectric layer comprises a first dielectric layer formed by PECVD and a second dielectric layer formed by HDPCVD.

2. The method as claimed in claim 1, wherein the dielectric layer is silicon oxide or silicon oxynitride.

3. The method as claimed in claim 1, wherein polishing of the dielectric layer is accomplished by CMP.

4. The method as claimed in claim 1, wherein the conductive patterns have a thickness of 8000 Å~10000 Å.

5. The method as claimed in claim 1, wherein the polished dielectric layer has a thickness of 2000 Å~4000 Å A on the conductive patterns.

6. The method as claimed in claim 1, further comprising forming a color filter layer on the dielectric layer, coating an upper dielectric layer on the color filter layer, forming a plurality of microlenses on the upper dielectric layer, and forming a protective layer on the microlenses.

* * * * *